United States Patent
Browning et al.

(10) Patent No.: US 12,191,110 B2
(45) Date of Patent: Jan. 7, 2025

(54) REDUCED SPATIAL/TEMPORAL OVERLAPS TO INCREASE TEMPORAL OVERLAPS TO INCREASE PRECISION IN FOCUSED ION BEAM FIB INSTRUMENTS FOR MILLING AND IMAGING AND FOCUSED ION BEAMS FOR LITHOGRAPHY

(71) Applicant: THE UNIVERSITY OF LIVERPOOL, LIVERPOOL (GB)

(72) Inventors: Nigel D Browning, Formby (GB); Daniel Nicholls, Wigan (GB)

(73) Assignee: THE UNIVERSITY OF LIVERPOOL, Liverpool (GB)

( * ) Notice: Subject to any disclaimer, the term of this patent is extended or adjusted under 35 U.S.C. 154(b) by 275 days.

(21) Appl. No.: 17/725,177

(22) Filed: Apr. 20, 2022

(65) Prior Publication Data
US 2023/0011739 A1    Jan. 12, 2023

Related U.S. Application Data

(60) Provisional application No. 63/177,143, filed on Apr. 20, 2021.

(51) Int. Cl.
*H01J 37/147*     (2006.01)
*G03F 7/00*       (2006.01)
*H01J 37/305*     (2006.01)
*H01J 37/317*     (2006.01)

(52) U.S. Cl.
CPC ........ *H01J 37/1474* (2013.01); *G03F 7/7005* (2013.01); *G03F 7/70358* (2013.01); *H01J 37/3053* (2013.01); *H01J 37/3174* (2013.01); *H01J 2237/31749* (2013.01)

(58) Field of Classification Search
CPC ............... H01J 37/1474; H01J 37/3053; H01J 37/3174; H01J 2237/31749; H01J 37/3026; H01J 37/305; H01J 2237/31701; H01J 2237/31735; H01J 2237/3175; H01J 2237/31761; G03F 7/7005; G03F 7/70358
See application file for complete search history.

(56) References Cited

U.S. PATENT DOCUMENTS

| | | | |
|---|---|---|---|
| 10,190,953 B2 * | 1/2019 | Delpy | G01N 1/286 |
| 2003/0085352 A1 * | 5/2003 | Lezec | G01N 23/225 |
| | | | 250/306 |

(Continued)

FOREIGN PATENT DOCUMENTS

EP    2433293 B1 *    9/2013    ............ H01J 37/265

*Primary Examiner* — David E Smith
*Assistant Examiner* — Christopher J Gassen
(74) *Attorney, Agent, or Firm* — Hoffman Warnick LLC

(57) ABSTRACT

A beam control method is provided that can be implemented with any hardware system for imaging and/or cutting such as SEM/FIB/HIM or charged particle lithography which alleviates the deposited energy overlap between pixels to increase resolution and precision while reducing damage. The method includes scanning a workpiece with e-beam lithography, proton lithography, ion beam lithography, optical lithography, ion beam imaging or FIB in a reduced or sub-sampled pattern, to reduce beam overlap, which can include the step of scanning the beam ensuring that there is the largest difference in time and space between consecutive beam locations.

10 Claims, 6 Drawing Sheets

(56) References Cited

U.S. PATENT DOCUMENTS

| | | | | |
|---|---|---|---|---|
| 2005/0133734 A1* | 6/2005 | Moriya | ............... | H01J 37/3174 |
| | | | | 250/492.2 |
| 2006/0286772 A1* | 12/2006 | Pearl | ........................ | G01N 1/32 |
| | | | | 438/460 |
| 2010/0294930 A1* | 11/2010 | Preikszas | .............. | H01J 37/026 |
| | | | | 250/307 |
| 2014/0131195 A1* | 5/2014 | Bruland | ................ | H01J 37/228 |
| | | | | 204/298.36 |
| 2019/0259572 A1* | 8/2019 | Noda | .................... | H01J 37/063 |
| 2020/0118791 A1* | 4/2020 | Teguri | ................. | H01J 37/3177 |

* cited by examiner

PRIOR ART

PRIOR ART

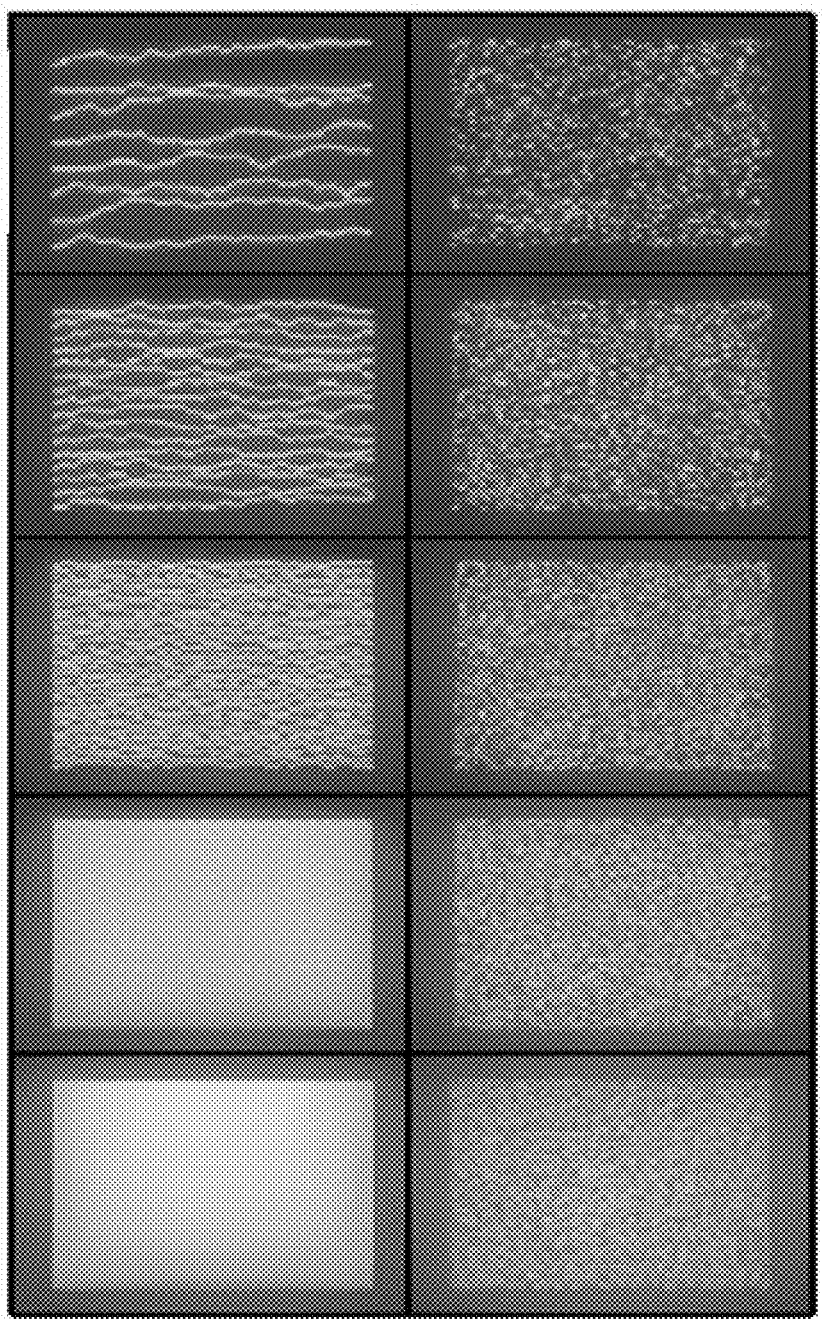

REDUCED SPATIAL/TEMPORAL OVERLAPS TO INCREASE TEMPORAL OVERLAPS TO INCREASE PRECISION IN FOCUSED ION BEAM FIB INSTRUMENTS FOR MILLING AND IMAGING AND FOCUSED ION BEAMS FOR LITHOGRAPHY

This application claims the benefit of U.S. Provisional Application 63/177,143 filed Apr. 20, 2021.

BACKGROUND

Focused ion beam, also known as "FIB", is a technique used particularly in the semiconductor industry, materials science and increasingly in the biological field for site-specific analysis, deposition, and ablation of materials.

Examples of focused ion beam apparatus are disclosed in U.S. Pat. Nos. 9,245,712; 9,269,539; 8,822,945; 8,581,206; 8,513,602; 7,935,943; 7,897,918; 7,235,798; 7,154,106; 7095,024 and 7,053,383, all of which are hereby incorporated by reference to the extent they are not contrary to the present disclosure.

A FIB setup is a scientific instrument that resembles a scanning electron microscope (SEM). However, while the SEM uses a focused beam of electrons to image the sample in the chamber, a FIB setup instead uses a focused beam of ions. FIB can also be incorporated in a system with both electron and ion beam columns, allowing the same feature to be imaged using either of the beams. Similar approaches for imaging are also implemented in the Helium Ion Microscope (HIM) where the ions are used to image the sample rather than electrons. A Helium Ion microscope is described in U.S. Pat. Nos. 8,748,845, and 8,766,219 which are hereby incorporated by reference to the extent they are not contrary to the present disclosure.

Although the technique known as FIB is primarily used for specimen preparation for analytical methods, similar control procedures are used when a beam of focused ions is manipulated for direct write lithography.

FIG. 1 is a diagram of a prior art process of how FIB and/or charged particle lithography is used to etch a sample.

FIG. 2 illustrates a lithography process, whereby the primary beam incident on the specimen leads to the creation of multiple scattering events and the expulsion of ions from a volume that is larger than the primary beam illumination area. For both FIB and lithography, the spread of the beam from one location to the other limits the precision of the process. FIG. 2 shows how the primary beam "A" (shown in dashed line) extends over a wider area of sample due to multiple scattering events "B" (shown in solid line). In a scanning mode of operation, where the primary beam can be moved from one pixel (here a pixel is defined as a unit of specimen surface area) to a neighboring pixel, this larger scattering of the primary beam can result in an overlap of influence between the pixels.

The imaging/cutting process for FIB/HIM and charged particle lithography is a serial process where the beam is moved sequentially along a line or over a 2D/3D area or volume. In each case, if the amount of energy deposited in the sample exceeds a minimum value the sample is cut or milled away. Typically, the process is understood to be independent in each pixel.

The present inventors have recognized that when the energy deposited in the sample increases, which would be the case during image/mill/cut with higher speed or precision, there is an overlap between the energy deposited in each pixel, resulting in a broader distribution of scattering events. This broader distribution reduces the spatial resolution of all imaging modes (whether using electrons and/or ions), increases the amount of beam damage to the sample that occurs either unintentionally during imaging or intentionally during cutting, and therefore results in a decrease in the precision of deliberate cutting/milling of the sample.

SUMMARY

The present invention provides a beam control method that can be implemented with any hardware system for imaging and/or cutting such as SEM/FIB/HIM or charged particle lithography which alleviates the deposited energy overlap between pixels to increase resolution and precision while reducing damage.

The method includes scanning a workpiece with e-beam lithography, proton lithography, ion beam lithography, optical lithography, ion beam imaging or FIB in a reduced or sub-sampled pattern, to reduce beam overlap, which can include the step of scanning the beam ensuring that there is the largest difference in time and space between consecutive beam locations.

This disclosure recognizes that the use of random scanning and/or a structured variable distance/time between consecutive pixels instead of the regular scan approach can minimize the spread of the primary beam in the sample, increasing image resolution, decreasing the spatial extent of milling damage and increasing line precision. Specifically, this invention recognizes that when the energy deposited in the sample increases, which would be the during image/mill/cut with higher speed or precision, there is an overlap between the energy deposited in each pixel, resulting in a broader distribution of scattering events. This broader distribution reduces the spatial resolution of all imaging modes (whether using electrons and/or ions), increases the amount of beam damage to the sample that occurs either unintentionally during imaging or intentionally during cutting, and therefore results in a decrease in the precision of deliberate cutting/milling of the sample.

Numerous other advantages and features of the present invention will be become readily apparent from the following detailed description of the invention and the embodiments thereof, and from the accompanying drawings.

BRIEF DESCRIPTION OF THE DRAWINGS

FIGS. 5A-5J are diagrams of scanning patterns where neighboring pixels are removed from the scanning process.

DETAILED DESCRIPTION

While this disclosure may be implemented in any number of ways, the disclosure and drawings provide specific embodiments with the understanding that the present disclosure is to be considered as an exemplification of the principles of the disclosure and is not intended to limit the invention to the specific embodiments illustrated.

A method according to the invention alleviates overlap damage to pixels.

The amount of overlap is calculated by using equation 1, where the "influence" of the beam per pixel per time step can be calculated at every pixel in the system. The first term of the equation, $D\nabla^2\varphi$, calculates the amount of beam influence/damage is diffusing away from the pixel, and the second term, $f$, is the amount of influence at that pixel created by the incident beam. The amount of beam influence that is deposited is determined by the probe location, which is generated via the scanning pattern, and beam broadening, which is governed by equation 2. If the pixel is within the area of irradiation, beam influence is added $$\frac{\partial \varphi}{\partial t} = D\nabla^2 \varphi + f \quad (1)$$

where D is the diffusion constant associated with the beam influence and $\varphi(x,y,z,t)$ is defined as the beam influence per unit volume. The source term, $f$, is analogous to the incident beam dimension (i.e., probe size) that adds beam influence to the system. Beam broadening is defined by:

$$b = 8 \times 10^{-12} \frac{Z}{E_0} (N_v)^{1/2} T^{3/2} \quad (2)$$

where b is the amount of beam broadening and T is the sample thickness, both in m, Z is the atomic number, $E_0$ is the beam energy, and $N_v$ is the number of atoms/m$^3$. As mentioned previously diffusion profile overlap and beam broadening overlap, herein referred to jointly as beam overlap, happens in three ways—point-to-point, line-to-line, and scan-to-scan.

Equation 1 has the form of any interaction between a charge beam and/or electromagnetic radiation with a solid/liquid sample. This approach of minimizing the overlapped area/volume should therefore allow for increased precision in a wide range of applications of this approach, including e-beam lithography, proton lithography, ion beam lithography, optical lithography, ion beam imaging and FIB.

A summary of the cumulative effect of this overlap is shown in FIGS. 3A-4B.

Figure 1:
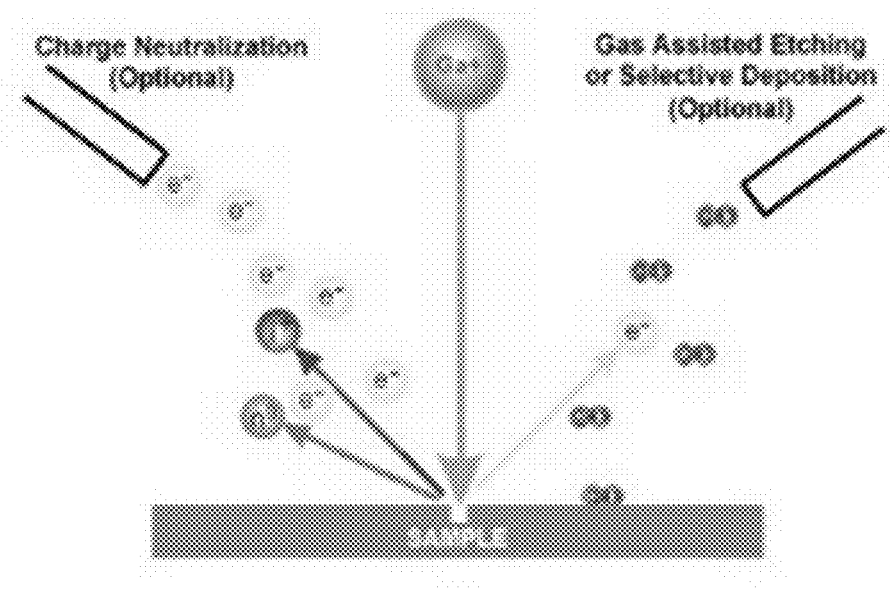
FIG. 1 is a diagram of a prior art process of how FIB and/or charged particle lithography is used to etch a sample.
Figure 2:
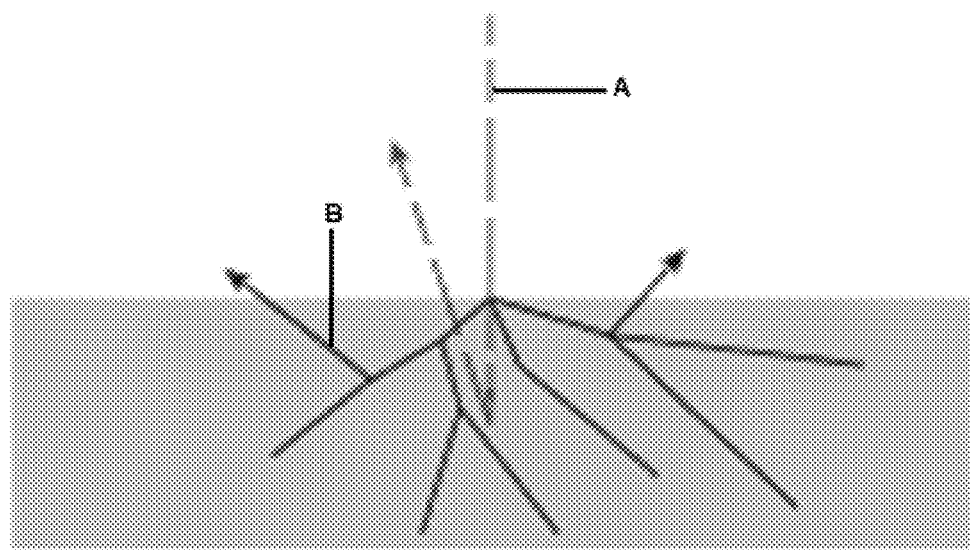
FIG. 2 is diagram of the process of lithography.
Figure 3A:
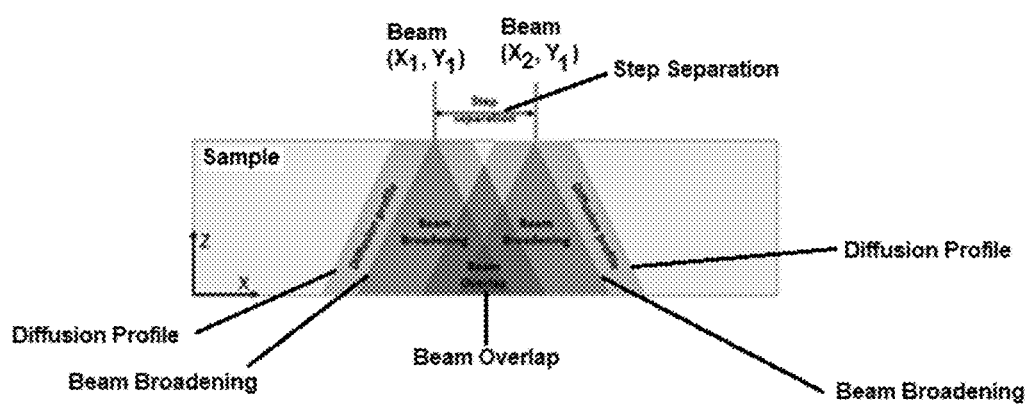
FIG. 3A is a diagrammatic side sectional view of a workpiece subjected to a processing method not of the present invention.

FIG. 3A is a diagrammatic side sectional view of a workpiece subjected to a processing method not of the present invention, where the overlapping influence is seen in electron beam instruments used for imaging (not related to the lithography mechanisms in this application).

Figure 3B:
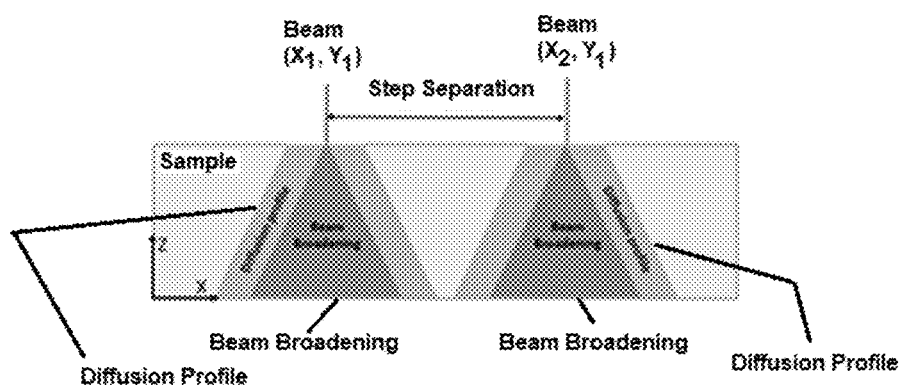
FIG. 3B is a diagrammatic side sectional view of a workpiece subjected to a processing method of the present invention.
Figure 4A:
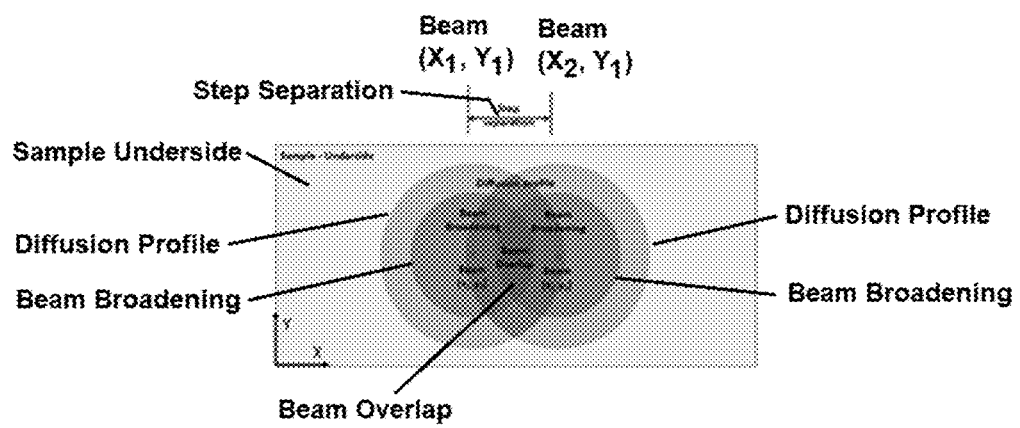
FIG. 4A is a bottom view of the workpiece shown in FIG. 3A, subjected to a process not in accordance with the present invention.
Figure 4B:
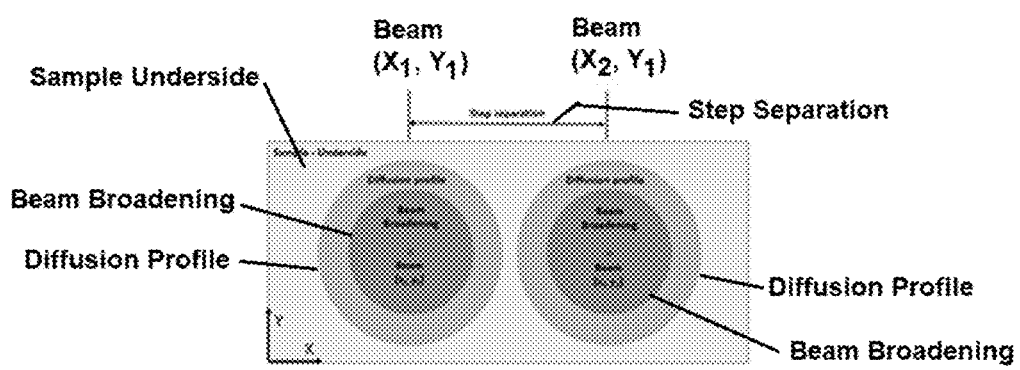
FIG. 4B is a bottom view of the workpiece shown in FIG. 3A subjected to the processing method of the present invention.

FIGS. 3A and 4A illustrate small step separations between successive sampling points causes beam overlap due to beam broadening and/or diffusion effects. Increasing the step separation beyond a certain value reduces the effects of beam overlap as shown in FIGS. 3B and 4B.

The size of the overlap region is dependent on the energy of the incident particles, the diffusion of the incident particles throughout the sample and the diffusion/interaction of any damage/radiation products created by the incident beam in the sample being imaged/milled/cut. The value of all these parameters (the diffusion parameters are specimen dependent) determines how far apart the sequential scan positions should be set to avoid the extra effect of the beam overlap, i.e. what the control parameter should be to minimise the effect.

Figure 6:
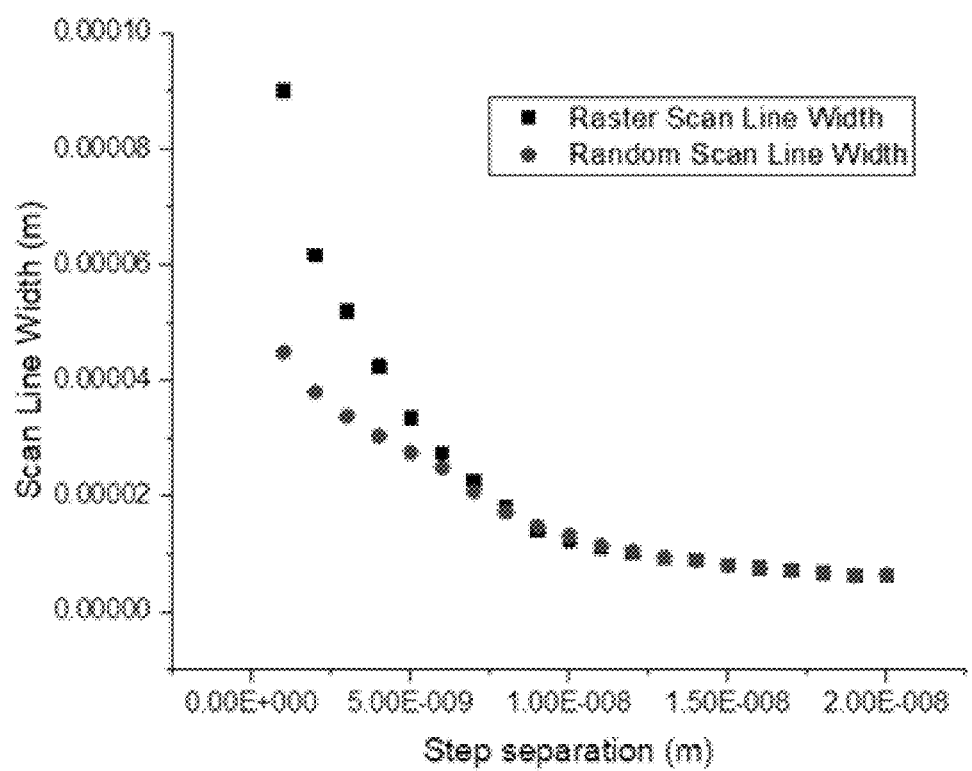
FIG. 6 is a diagram comparing the results of the ion overlap regions for the raster scan with the sub-sampled random scan.

For any scanning pattern, therefore, the optimal approach that will minimize the effect of the beam overlap process is to scan the beam ensuring that there is the largest difference in time and space between consecutive beam locations. Structured scanning patterns giving a "random" distribution of illuminated pixels are shown in FIGS. 5A-5J. Such patterns are almost identical to the fully random pattern that would be used by compressive sensing algorithms to maximally reconstruct an image from a sub-sampled acquisition. Compressive sensing algorithms are disclosed in U.S. Pat. Nos. 10,224,175 and 10,256,072 herein incorporated by reference to the extent that they are not contrary to the present disclosure. If a pattern has a reduced number of sampled pixels used, then the width of the deposited/damaged/milled/cut region can be minimised. Using the equations here for typical energy and scan parameters for a commercial FIB/lithography system, FIG. 6 shows the linewidth of a FIB cut can be reduced significantly at the highest spatial resolution (i.e. when the pixel step separation is smallest) by using a random scan that minimizes the spatial/temporal overlaps.

FIGS. 5A and 5F are images of random sampled patterns without the optimal approach that will minimize the effect of the beam overlap.

FIGS. 5B-5E and 5G-5J illustrate a set of randomly sampled patterns, each can be performed sequentially to fill all pixels in the scan area with increasing space/time between neighbouring pixels. FIGS. 5E and 5J represent random scanning with the maximum space/time between neighbouring pixels. In FIGS. 5B-5E and 5G-5J neighboring pixels are removed from the scanning process.

Viewing FIGS. 5A-5E, more pixels are removed from left to right, meaning that the FIG. 5E has less "beam overlap influence" than FIG. 5A. For example, FIG. 5A is an image representing a 100% random sampled pattern. FIG. 5B is an image representing a 50% random sampled pattern, a reduction in sampled pixels to minimize the effect of the beam overlap. FIG. 5C is an image representing a 25% random sampled pattern, a further reduction in sampled pixels to minimize the effect of the beam overlap. FIG. 5D is an image representing a 12% random sampled pattern, a further reduction in sampled pixels to minimize the effect of the beam overlap. FIG. 5E is an image representing a 6% random sampled pattern, a further reduction in sampled pixels to minimize the effect of the beam overlap. The scans of FIGS. 5A-5E represent random "walk" scans wherein the random selection of pixels is only along the Y axis (vertical axis in the Figures) wherein the scan sequences in structured fashion through the X axis (horizontal axis in the Figures). The scans shown in FIGS. 5A-5E are for a "line-hop" acquisition where hysteresis in the scan system does not allow for complete random movements of the ion beam.

Viewing FIGS. 5F-5J, more pixels are removed from left to right, meaning that the FIG. 5J has less "beam overlap influence" than FIG. 5F. For example, FIG. 5F is an image representing a 100% sampled pattern. FIG. 5G is an image representing a 50% random sampled pattern, a reduction in sampled pixels to minimize the effect of the beam overlap. FIG. 5H is an image representing a 25% random sampled pattern, a further reduction in sampled pixels to minimize the effect of the beam overlap. FIG. 5I is an image representing a 12% random sampled pattern, a further reduction in sampled pixels to minimize the effect of the beam overlap. FIG. 5J is an image representing a 6% random sampled pattern, a further reduction in sampled pixels to minimize the effect of the beam overlap. The scans of FIGS. 5F-5J represent random scans wherein the random selection of pixels is along both the Y axis and the X axis.

FIG. 6 illustrates that by performing a structured random scanning where the time between neighbouring pixels in the scan area is maximised, the beam overlap can be reduced and the width of the milled/cut/transformed area/volume can be reduced.

FIG. 6 is a diagram comparing the results of the ion overlap regions for the raster scan with the sub-sampled random scan. Specifically, for the highest magnification scans, i.e., where the pixels are smaller and closer together, the random scan results in a narrower line width. This is due to a reduction in the overlap influence effects and results in any lithographic process having higher resolution/precision.

A method of the present invention comprises the steps of:
determining the workpiece material and thickness;
determining the beam influence of the scanning beam according to $$\frac{\partial \varphi}{\partial t} = D\nabla^2 \varphi + f;$$

for the material and the thickness determining the beam broadening of the scanning beam according to $$b = 8 \times 10^{-12} \frac{Z}{E_0} (N_v)^{1/2} T^{3/2}$$

for each scanned pixel in a scan pattern, using scanning software, separating the location of the scanned pixel to minimize beam overlap caused by beam influence plus beam broadening, from the adjacent scanned pixel; and
using a compressive sensing algorithm, filling in the missing scanned pixels.

The method can further be enhanced by starting with a random scan sequence, either with a random scan along two dimensions X and Y; or a random scan only along one dimension X or Y.

The exemplary methods of the invention can be applied to multi-beam instruments—a FIB is typically a dual beam instrument, while a HIM can be a tri-beam instrument (this means that the electron beam, and ion beams operate independently at the same time).

The ion beam(s) and electron beam can operate at the same time, each using a different sub-sampled part of the 2D array—for example the electron beam could use a random 50% of the pixels in the array and the ion beam could use the other 50%. Note that this doesn't have to add up to 100%—all beams could use a random 10% of the pixels, which could overlap as long as they are not at the same pixel at the same time. The advantage here is there is no overlap of the beams (and the effect on the image/milling that would cause), making them more precise.

A sub-sampled electron beam could be implemented to provide a fast image acquisition during milling. The electron beam could be as low as 1% sampled, which has a minimal effect on the ion beam. This means that the electron image could be up to 100 times faster than the ion scan causing the milling, i.e., the ion dynamics can be imaged during the scan rather than after the scan. The ion beam raster could also be from 100% down to below 1%.

As the sub-sampled electron beam image is faster than the ion beam milling approach (this also can be applied to the ion beam in the HIM that is used for SIMS), the electron beam can be used to adapt the scan to mill dynamically and continuously only the areas of interest, i.e., if something is observed going wrong/right in the image, the FIB beam can be controlled.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. A method of scanning a workpiece using at least one beam of particles, the method comprising:
scanning the workpiece using the at least one beam of particles and a reduced or sub-sampled scanning pattern that moves the beam across the workpiece in a path that maximises a time when neighbouring pixels of the workpiece are scanned in order to minimise beam overlap at each pixel, wherein a pixel is a unit of area of the workpiece,
wherein the beam of particles is a beam suitable for any one of the following techniques: e-beam lithography, proton lithography, ion beam lithography, optical lithography, ion beam imaging, and focused ion beam lithography.

2. The method according to claim 1, wherein using a reduced or sub-sampled scanning pattern includes using a structured random scanning pattern to minimise a width of an influence of the at least one beam of particles per pixel of the workpiece.

3. The method according to claim 2, further comprising:
calculating an amount of beam overlap at each pixel of the workpiece by calculating, at each pixel:
an amount of influence of the beam of particles caused by the at least one beam diffusing away from the pixel upon which the beam is incident, and
an amount of influence created on the pixel upon which the beam of particles is incident.

4. The method according to claim 3 further comprising:
generating the structured random scanning pattern using the calculated amount of beam overlap by:
for each pixel on which the beam is to be incident, determining when to scan a neighbouring pixel to minimise influence of the beam on the neighbouring pixel.

5. The method according to claim 1, wherein scanning the workpiece using the at least one beam of particles includes:
scanning the workpiece using an ion beam;
scanning the workpiece using an electron beam; and
wherein the workpiece is scanned with the ion beam and electron beam independently.

6. The method according to claim 5, wherein scanning the workpiece includes scanning the workpiece concurrently with the electron beam and ion beam, wherein each scan operates on different pixels of a 2D array of pixels of the workpiece.

7. The method according to claim 6, wherein:
scanning the workpiece using the electron beam and a reduced or sub-sampled scanning pattern includes:
selecting a random selection of the pixels in the 2D array, wherein the random selection of the pixels forms a pre-defined percentage of total pixels in the 2D array determining the scanning pattern which maximises a time when neighbouring pixels of the selected pixels are scanned; and scanning the selected pixels using the determined scanning pattern; and scanning the workpiece using the ion beam includes scanning remaining pixels in the 2D array.

8. The method according to claim 6, wherein:

scanning the workpiece using the electron beam includes scanning a first selection of pixels in the 2D array; and scanning the workpiece using the ion beam includes scanning a second selection of pixels in the 2D array, wherein at least some of the pixels in the first selection of pixels and the second selection of pixels are the same, and wherein the pixels that are the same are scanned at different times by the ion beam and the electron beam.

9. The method according to claim 6, wherein:

scanning the workpiece using the ion beam includes using the ion beam to perform a milling operation on the workpiece; and scanning the workpiece using the electron beam includes using the electron beam to provide a fast image acquisition during the milling operation.

10. The method according to claim 5, wherein:

scanning the workpiece using the ion beam includes using the ion beam to perform a milling operation;

scanning the workpiece using the electron beam includes using the electron beam to image the workpiece; and the method further includes adapting the ion beam to perform the milling operation only on pixels in areas of interest identified from the image of workpiece.

\* \* \* \* \*